United States Patent
Heberle

[11] Patent Number: 5,302,968
[45] Date of Patent: * Apr. 12, 1994

[54] WIRELESS REMOTE CONTROL AND ZOOM SYSTEM FOR A VIDEO DISPLAY APPARATUS

[75] Inventor: Klaus Heberle, Reute, Fed. Rep. of Germany

[73] Assignee: Deutsche ITT Industries GmbH, Freiburg, Fed. Rep. of Germany

[*] Notice: The portion of the term of this patent subsequent to Sep. 8, 2009 has been disclaimed.

[21] Appl. No.: 850,473

[22] Filed: Mar. 12, 1992

Related U.S. Application Data

[63] Continuation-in-part of Ser. No. 558,261, Jul. 26, 1990, Pat. No. 5,146,210.

[30] Foreign Application Priority Data

Aug. 22, 1989 [EP] European Pat. Off. ........ 89115455.1

[51] Int. Cl.⁵ .............................................. G09G 1/06
[52] U.S. Cl. ................... 345/131; 345/146; 345/158; 348/734
[58] Field of Search ............. 340/706, 709, 710, 712, 340/731; 358/194.1, 180; 359/142, 159; 345/157, 158, 166, 180, 181, 156, 127, 128, 129, 130, 145, 146

[56] References Cited

U.S. PATENT DOCUMENTS

| | | | |
|---|---|---|---|
| 4,565,999 | 1/1986 | King et al. | 340/706 |
| 4,578,674 | 3/1986 | Baker et al. | 340/710 |
| 4,745,402 | 5/1988 | Auerbach | 340/709 |
| 4,754,628 | 6/1988 | Mori | 340/706 X |
| 4,935,619 | 6/1990 | Heberle | 340/710 X |
| 4,959,721 | 9/1990 | Micic et al. | 358/194 |
| 5,023,943 | 6/1991 | Heberle | 359/142 X |
| 5,032,989 | 7/1991 | Tornetta | 340/731 X |
| 5,146,210 | 9/1992 | Heberle | 340/706 X |

OTHER PUBLICATIONS

I.E.E.E. Transactions on Consumer Electronics "1988 International Conference on Consumer Electronics, Part 1" 34 (1988) Aug. No. 3, New York, NY, USA.

*Primary Examiner*—Jeffery Brier
*Assistant Examiner*—A. Au
*Attorney, Agent, or Firm*—Thomas L. Peterson

[57] ABSTRACT

A zoom system for enlarging a portion of a video image chosen on a display screen by a cursor wherein the cursor is controlled by a remote position-dependent transmitter. An electrooptical arrangement receives positional signals from the remote transmitter causing the cursor to move on the display screen in relation to the movement of the remote transmitter. The cursor is used to select a portion of the displayed video image to be enlarged. Once chosen by the cursor, the selected portion of the video image is enlarged in a zoom circuit and shown on the display screen in place and stead of the original image.

18 Claims, 4 Drawing Sheets

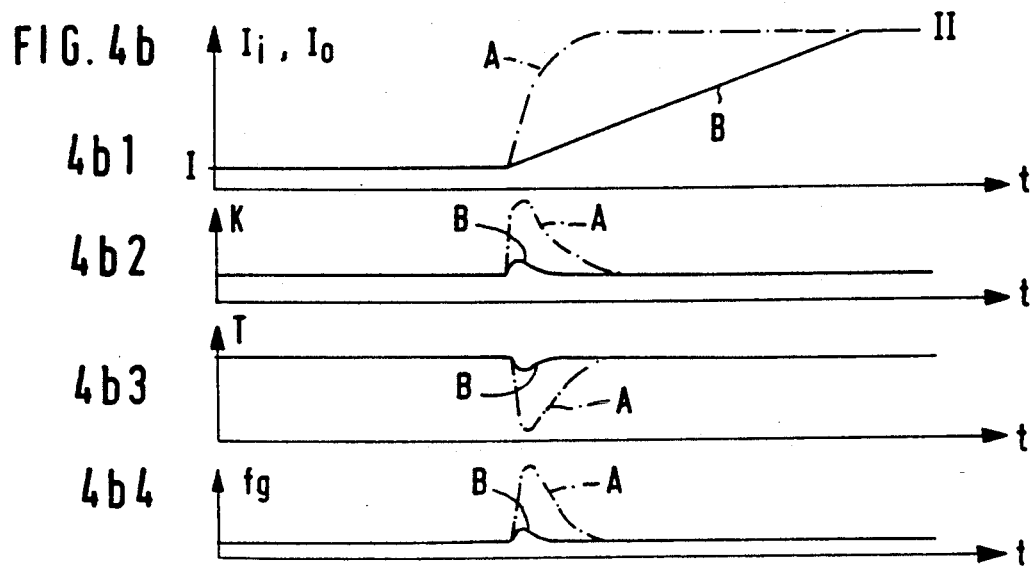
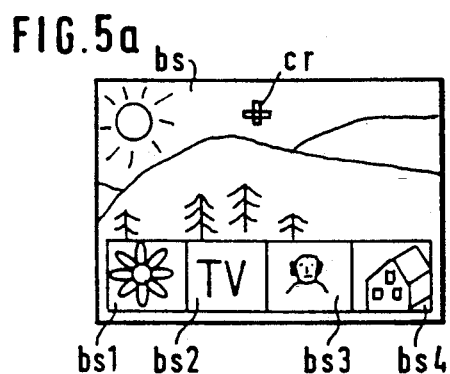
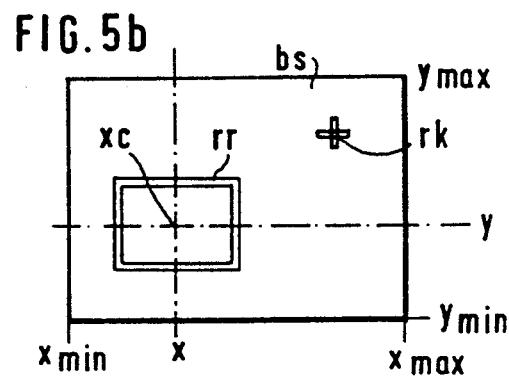
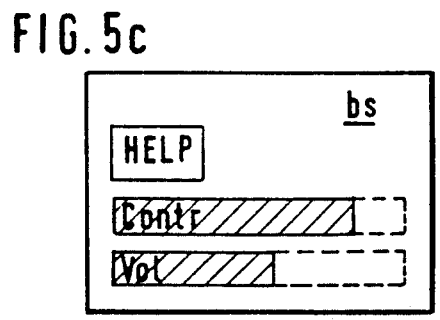
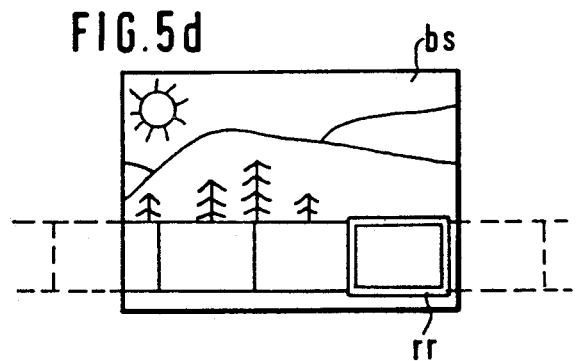
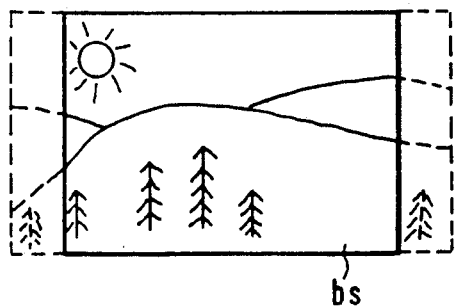

WIRELESS REMOTE CONTROL AND ZOOM SYSTEM FOR A VIDEO DISPLAY APPARATUS

CONTINUATION-IN-PART

This application is a continuation-in-part of U.S. patent application Ser. No. 07/558,261 to Heberle, filed Jul. 26, 1990 now U.S. Pat. No. 5,146,210 and entitled WIRELESS REMOTE CONTROL SYSTEM FOR A TELEVISION RECEIVER.

FIELD OF THE INVENTION

The present invention relates to a remote controlled zoom system for a video display apparatus, and more particularly to such remote control zoom systems that have position-dependent remote transmitters, an electrooptical loop which controls the motion of a cursor on a video display and a zoom circuit for enlarging the regions of the video display selected by the cursor.

BACKGROUND OF THE INVENTION

Remote control devices provide a convenient means for controlling video display apparatus such as television sets, video recorders and personal computers. Because the video display apparatus typically contains a large number of tuning and operational functions, remote control can become complicated, especially from a distance. To control the large number of functions required by the video display apparatus, an interactive mode is provided in which a user selects the desired function from a succession of menus. Each menu provides symbols and fields which correspond to functions such as volume. The user simply selects the desired function by positioning the cursor within a field.

The position of the cursor is typically controlled by the remote control device. One such remote control system is disclosed by application Ser. No. 07/450,971, filed by Heberle on Dec. 15, 1989 and assigned to ITT Corporation, which is entitled "ELECTROOPTICAL POINTING DEVICE FOR REMOTELY CONTROLLING ELECTRONIC APPARATUS" and incorporated herein by reference. There, an electrooptical arrangement determines the relative motion of a cursor on a television screen by evaluating the relative angular positions of a transmitter in different reference planes with respect to a reference line between the transmitter and the television receiver. The transmitter is formed by three sources of radiation whose signals are emitted along three parallel optical axes. Each axis determines a reference plane. Two sources have rising/falling radiation patterns. The third source, which provides a reference signal, has a flat radiation pattern. The electrooptical arrangement, located at the front of the television receiver, detects the radiation patterns, determines tilting of the transmitter by evaluating the relation between signal intensities of the three radiation patterns, and generates reference signals which correspond to the tilt angles in the vertical or horizontal directions. thus, the combined evaluation of the two directions of tilting permits continuous motion control in any direction on the screen. Analog functions can be controlled by the relative motion of the cursor. For instance, a slider control for volume is displayed symbolically by a bar. To increase or decrease volume, the bar is either lengthened or shortened by the motion of the cursor.

Since the position of the cursor is dependant upon the motion of the transmitter, it becomes apparent that an unsteadiness in the hand of a user has a negative effect on the cursor position. A resulting high frequency jitter of only a few hertz causes the cursor to jump around the screen. Even if in small excursions, this jitter prevents the user from positioning the cursor precisely within a field on the screen. The prior art has approached this problem by increasing the area of the field for each menu entry. However, this method has the unwanted effect of reducing the number of functions available on the screen. Alternately, a lowpass filter is employed to suppress the high frequency jitter. However, a lowpass filter degrades the overall performance of the remote control since the cursor follows the course adjustment sluggishly.

SUMMARY OF THE INVENTION

The present invention provides a zoom system for enlarging a selected portion of a video image utilizing a remote control transmitter. The zoom system includes an electrooptical arrangement that generates a cursor on a display screen. The remote control transmitter transmits data to the electrooptical arrangement controlling the position of the cursor on the screen so that the cursor can be used to define the portion of the video image that will be enlarged. The remote control transmitter controls the position of the cursor by transmitting positional signals with signal intensities indicative of the position of the transmitter, wherein an unsteady change in the position of the transmitter creates a high frequency component in each of the positional signals.

The electrooptical arrangement is responsive to the positional signals transmitted by the remote control transmitter, resulting in the movement of the cursor on the screen corresponding to a change in position for the remote control transmitter. The electrooptical arrangement receives and digitizes the positional signals, filtering out the high frequency component from the positional signals and resolving the positional signals into coordinates that control the position of the cursor. The cursor is superimposed over a video image shown on a display screen. By moving the cursor on the screen, any portion of the video image can be selected utilizing cursor positions. Each frame of the video image is stored within a memory, the portion of the video image to be enlarged is read out of the memory and enlarged utilizing a zoom circuit. Consequently, any chosen portion of the original video image can be enlarged and viewed in place and stead of the original image.

BRIEF DESCRIPTION OF THE DRAWINGS

For a better understanding of the present invention, reference is made to the following description of an exemplary embodiment thereof, considered in conjunction with the accompanying drawings, in which:

FIG 4b is a timing diagram illustrating the operation of the adaptive filter shown in FIG. 4a; and FIGS. 5a-5e are pictorial representations of a television screen controlled by the present invention.

DETAILED DESCRIPTION OF THE FIGURES

Although the present invention is applicable to many different types of electronic apparatus, such as personal computers and video recorders, it is especially suitable to be adapted for use with video display apparatus, such as television receivers. Accordingly, the present invention will be described in connection with a television receiver.

Figure 1:
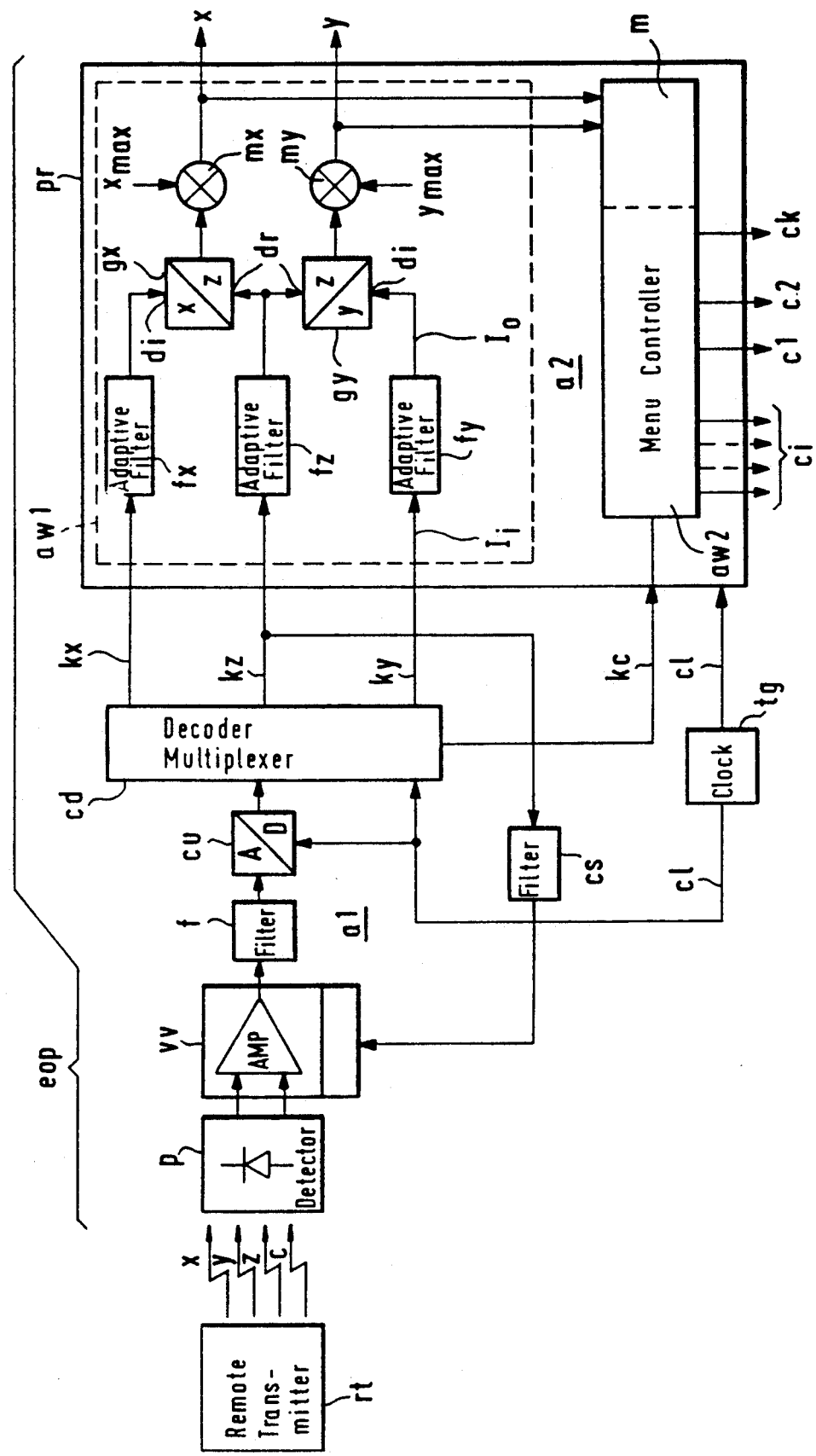
FIG. 1 is a schematic block diagram of one preferred embodiment of the electrooptical arrangement component of the present invention.

Referring to FIG. 1, it can be seen that the present invention includes the remote control transmitter rt. The type of remote control transmitter rt shown is disclosed in application Ser. No. 07/450,971 filed on Dec. 15, 1991, which has already been incorporated herein by reference. The remote control transmitter rt transmits three sources of radiation, hereinafter referred to as positional signals X, Y and Z, whose patterns have different intensity distributions in three spatial planes. The positional signals X, Y and Z define the position of a cursor on a video screen. The remote control transmitter rt is provided with a keyboard and coding circuit to produce a coded signal C, which corresponds to control commands. Among the commands is a click command, which will be described hereinafter. The positional signals X, Y and Z and the coded signal C are transmitted in a time-division multiplex mode. In alternate embodiments, the positional signals X, Y, Z and C are transmitted on an infrared frequency. However, the signals X, Y, Z and C can be transmitted on frequencies other than infrared, including visible light and microwave.

In FIG. 1, there is shown an electrooptical arrangement eop having a radiation detector p that receives the coded signal C and the positional signals X, Y and Z from the remote control transmitter rt and converts them into a single, multiplexed analog signal. In the preferred embodiment, the radiation detector p contains an infrared-receiving diode. The analog output of the radiation detector p is amplified by variable-gain amplifier vv and filtered by a noise suppression filter f. The suppression filter f removes interference in the optical transmission path, which is caused by signal noise and spurious signals. The analog output of the noise suppression filter f is converted to a digital signal by an analog-to-digital (A/D) converter cu. A decoder circuit cd separates the output of the A/D converter cu into three component signals kx, ky and kz and the coded command signal kc. The three component signals kx, ky and kz correspond to the positional signals X, Y and Z, respectively. In the preferred embodiment, the decoder cd is a multiplexer which is controlled by a clock signal c1 generated by clock generator tg.

The component signal kz is fed through a control-loop filter cs to provide a feedback signal for the variable-gain amplifier vv. The gain of the amplifier vv is digitally variable within a wide range. This is required in order to compensate for variations in absolute intensity of the positional signals X, Y and Z arising from changes in the distance between the remote control transmitter rt and the electrooptical arrangement eop. As the distance between the remote control transmitter rt and electrooptical arrangement eop is increased, the amplitude of the positional signals X, Y and Z is decreased. Without the variable gain amplifier vv, the A/D converter cu would not be able to quantize the small amplitudes of the positional signals, primarily because the A/D converter cu employs only a few quantization levels.

The three component signals kx, ky and kz are fed to adaptive filters fx, fy and fz, respectively, which remove the high frequency jitter component, caused by the unsteadiness of the user's hand. A detailed description of the adaptive filter fx, fy and fz will be provided with a discussion of FIG. 4a. The adaptive filters fx, fy and fz can be realized in hardware. However, since a programmable microprocessor pr is already provided, and since the rate of change of signals kx, ky and kz is slow in comparison to the frequency of the clock signal c1, it is more practical to realize the adaptive filters fx, fy and fz through software. Thus, the component signals kx, ky and kz are input directly to the microprocessor pr, where the high frequency jitter components are removed.

An evaluation circuit awl, realized by software in the microprocessor pr, processes the outputs of the adaptive filter circuits fx, fy and fz to obtain the x- and y-coordinate values x and y, which correspond to the position of the cursor on the screen. The x-coordinate x is obtained by evaluating the relative intensity differences in a horizontal direction between the filtered components kx and kz. A first divider gx divides the filtered component signal kx (the dividend) by the filtered component signal kz (the divisor). The resulting output of the first divider gx provides a scale factor variable having a value between zero and unity. A first multiplier mx multiplies the output of the first divider gx by a constant xmax, which corresponds to the width of the screen. The resulting output of the first multiplier mx provides the x-coordinate x. Similarly, the y-coordinate y is obtained by evaluating the relative intensity differences in a vertical direction between the components ky and kz. A second divider gy divides the filtered component signal ky by the filtered component signal kz, and a second multiplier my multiplies the output of the second divider gy by a constant ymax to provide the y-coordinate y. Constant ymax corresponds to the height of the screen. Thus, the x- and y-coordinate values x and y are obtained by multiplying the respective maximum coordinate values xmax and ymax by their respective scale factors. It can be appreciated that the selection of maximum coordinate values xmax and ymax determines the range over which the cursor is moved. For instance, if the selected values for xmax and ymax are less than actual width and height of the screen, the cursor would be moved over only a portion of the screen. If, on the other hand, the selected values for xmax and ymax are greater than actual width and height of the screen, the cursor could be moved outside the screen in an invisible, yet defined manner.

A menu controller m, also realized by software in microprocessor pr, decodes the coded command signal kc into a click command ck. The microprocessor pr also decodes the code command signal kc into first and second trigger signals c1 and c2, and a plurality of additional commands ci, which are fed to additional subcircuits (not shown). Additionally, the menu controller m displays a variety of menu entries on the screen and generates command signals in response to the selection of the menu entries. The menu entries are selected by positioning the cursor within a menu field and actuating the click command key on the remote control transmitter rt. The display functions and the use of the zoom function, via the remote control transmitter rt, will be described in greater detail in FIG. 2.

It has been noted that the evaluation circuit awl and menu controller m are realized by the microprocessor pr. The selection of a particular type of microprocessor is left to those skilled in the art. Furthermore, the general principles of construction of microprocessors are well known to those skilled in the art, and apart from their specific application to provide control called for by the present invention, are not described in detail herein.

Figure 2:
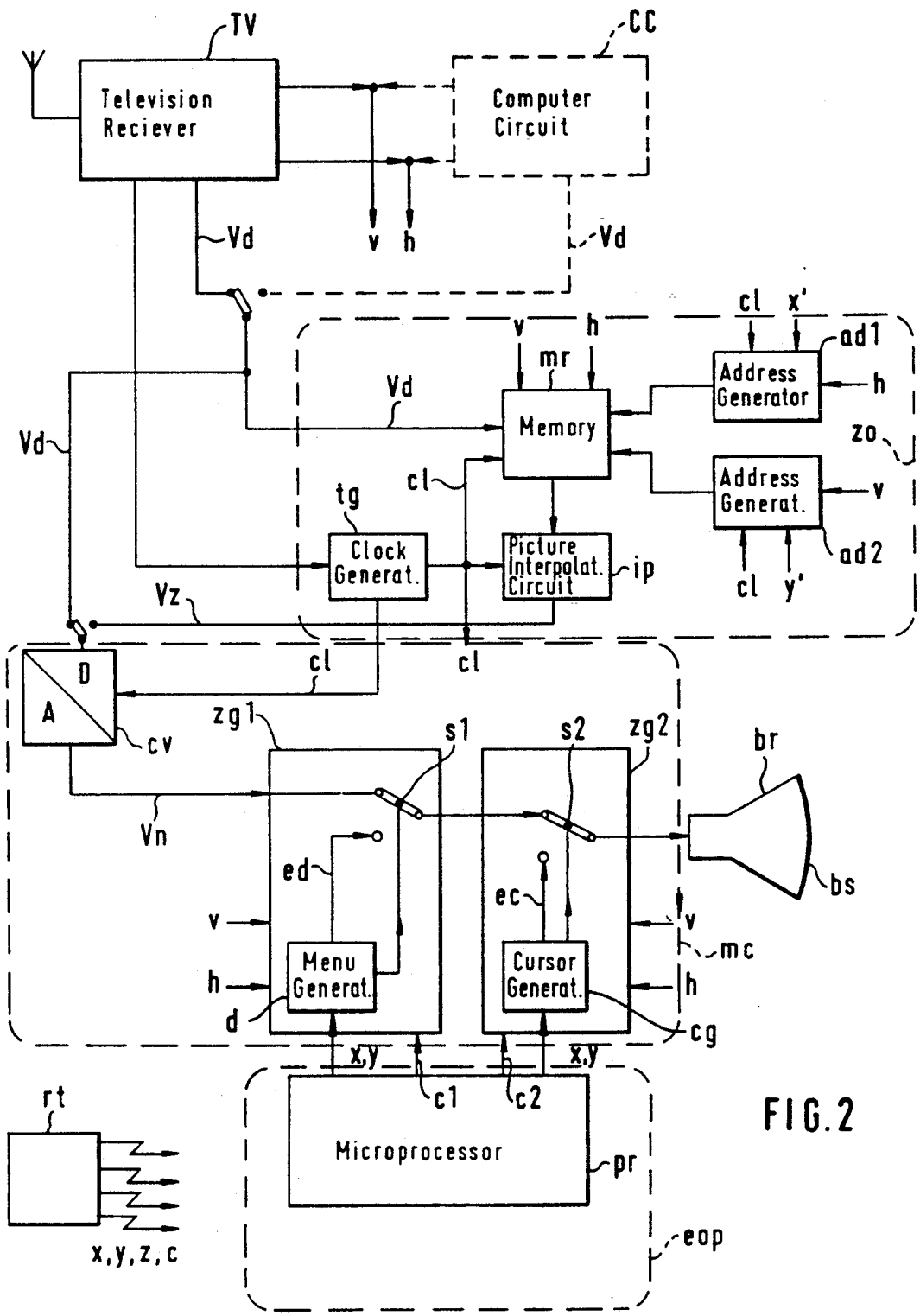
FIG. 2 is a schematic block diagram of the overall remote controlled zoom system constructed in accordance with one embodiment of the present invention.

Referring to FIG. 2, the overall remote activated zoom system is shown, inclusive of the electrooptical arrangement eop and remote control transmitter rt detailed in FIG. 1. In FIG. 2 a television receiver tv receives a transmitted signal through an antenna, and produces a digitized video signal Vd. A computer circuit cc is shown in hidden lines to illustrate that the digitized video signal Vd need not be created from a received television signal but, rather, the digitized video signal Vd can be formed from any electronic video display system such as a personal computer or a video recorder. Regardless of the applied source, the digitized video signal Vd provides the red, green and blue components of the image sequence that is to be provided to the picture tube br and viewed on screen bs.

As can be seen from FIG. 2, the present invention system includes four major circuits; the remote control transmitter rt, disclosed in U.S. patent application Ser. No. 07/450,971, previously incorporated by reference, the electrooptical arrangement eop, previously shown and discussed with FIG. 1, the menu-cursor generator circuit mc and the zoom circuit zo.

Referring to the menu-cursor generator circuit mc, it can be seen that the digitized video signal Vd is provided to a digital-to-analog (D/A) converter cv controlled by a clock signal c1, which is generated by a clock generator tg. The menu-cursor generator circuit mc also receives the X and Y coordinates, and trigger signals C1 and C2 from the electrooptical arrangement eop. Within the menu-cursor generator circuit mc are a first character generator zg1 and a second character generator zg2, which function to impose a menu and cursor over the image viewed on the display screen bs. The first character generator zg1 includes a menu generator d that applies an output signal to conductor ed, which signal contains fixed and continuously adjustable operating parameters that define the menu. Exemplary menus are illustrated in FIGS. 5a and 5c. Such menu operations are well known, and can be implemented, through software, by a person skilled in the art. For example, FIG. 5c shows a menu on the display screen bs for a contrast and volume control and which menu displays can be found on many well known prior art display systems. The second character generator zg2 includes a cursor generator cg that applies an output signal to conductor ec, which signal defines the cursor. The menu and cursor generators d and cg form a part of the menu controller and are realized by software in the microprocessor pr. The software required to generate the signals which display the cursor and menus can be developed by a person skilled in the art.

The digital-to-analog (D/A) converter cv creates an analog signal Vn from the digitized video signal Vd. The first and second character generators zg1 and zg2 are connected such that the output signal generated by the cursor generator cg has a higher priority for reproduction than the output signal generated by the menu generator d. The analog signal Vn is coupled to a conductor ed at the respective inputs of a first multi-wafer switch s1. The output conductor of the first multi-wafer switch s1 and conductor ec are coupled to respective inputs of a second multi-wafer switch s2. The output of the second multi-wafer switch s2 is coupled to the picture tube br. The multi-wafer switches s1 and s2, which are known to those skilled in the art, allow for fast switching between the analog signal Vn and the image created by the first and second character generators zg1 and zg2. Thus, the first character generator zg1 generates a menu which is imposed over the analog signal Vn and the second character generator zg2 generates a cursor which is imposed over both the analog signal Vn and the menu.

The first and second character generators zg1 and zg2 are activated by trigger signals c1 and c2, respectively, received from the electrooptical arrangement eop. After activation the first and second character generators zg1 and zg2 are controlled by the coordinate values x and y, received from the electrooptical arrangement eop, and the vertical and horizontal clock signals v and h. As has been previously described, the trigger signals c1 and c2, as well as the coordinate values x and y are recursively issued by the microprocessor pr of the electrooptical arrangement eop. It will be recognized by a person skilled in the art that the vertical and horizontal clock signals v and h, which indicate the start times of the vertical and horizontal deflection of the picture tube electron beam, can be issued by any well known deflection-synchronizing circuit.

The zoom circuit zo of the present invention system, shown in FIG. 2, utilizes the digital video signal Vd received from the television receiver tv or computer circuit cc. The purpose of the zoom circuit zo is to create a magnified video signal Vz that can be substituted for the digitized video signal Vd, wherein the magnified video signal Vz represents an enlarged segment of the original digitized video signal Vd. In other words, the zoom circuit zo is capable of enlarging a portion of the original video image being viewed. The zoom circuit zo includes a memory mr having a storage capacity to store at least one line of a video frame contained in the digitized video signal Vd. In the preferred embodiment, the memory mr should have the capacity to store at least one whole video frame. The write addresses for the memory mr are controlled by the vertical and horizontal clock signals v and h as well as the systems clock signal c1, generated by clock generator tg.

To enlarge a portion of image being viewed, a desired area is defined on the display screen bs using the remote control transmitter rt and the on-screen cursor, generated by the menu-cursor generator circuit mc. When an area of the display screen bs is being enlarged, the portion of the data stored in the memory mr that correspond to the chosen enlarged area, is read out. The addresses that are read out, particularly the modified start addresses, are generated by first and second address generators ad1 and ad2. The first address generator, which generates the addresses for the x-coordinate, is controlled by the system clock signal c1, a modified x-coordinate value x', and the horizontal clock signal h. The second address generator ad2, which generates the addresses for the y-coordinate, is controlled by the system clock signal c1, a modified y-coordinate value y', and the vertical clock signal v.

The data that is read out of memory mr is interpolated by a picture interpolation circuit ip. If, for example, the viewed video display is to be enlarged by one third in the horizontal direction, every third picture element must be read out twice and then must be suitably interpolated. Correspondingly, if the picture is to be enlarged by one third in the vertical direction, every third line must be read out twice and then must be interpolated. The output of the interpolation circuit ip is the magnified video signal Vz. The magnified video signal Vz is coupled to the menu-cursor generator circuit zo where it can be selectively chosen in place and stead of the original digitized video signal Vd. As should be apparent, the zoom circuit zo is not always utilized, and the use of the zoom does not effect the creation of the menu any cursor characters over the viewed image.

Many modern televisions include picture-in-picture (PIP) technologies wherein a small display of approximately 1/6 to 1/8 the size of the main picture is viewed simultaneously with the main picture on the screen. Similarly, personal computers produce picture-in-picture images (often called windows) when running many well known software packages. PIP technology is therefor a well utilized and well known technology to those skilled in the art, and the circuits for reducing such pictures within pictures need not be set forth in detail. In view of the above, it should be recognized by those skilled in the art that the zoom circuit zo of the present invention can be used to enlarge the smaller picture of a PIP application to fill the entire viewed screen. For example, in certain software typical of personal computers, small menu fields are often provided at the side or the top of viewed image. Utilizing the present invention, such image fields can be increased in size to command the entire image field. Similarly, if a small television image is shown in the corner of a large television image, the smaller image can be enlarged to fill the entire field of the screen bs.

Figure 3:
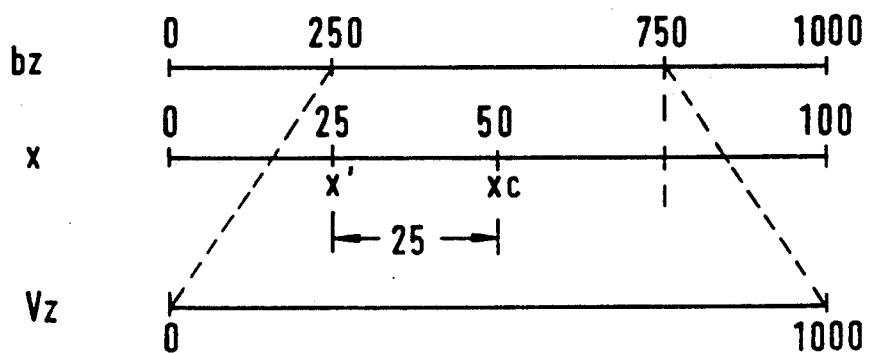
FIG. 3 is a diagram illustrating the enlargement of a stored image frame line by the zoom circuit shown in FIG. 2.

Assuming the digitized video signal Vd includes a video image line bz and line bz is stored within, and read from, memory mr, by referring to FIG. 3 it can be schematically shown how the stretching of the stored picture line bz is related to the x-coordinate value x, the modified cursor position x', and to the magnified video signal Vz. For the purpose of example, the screen bs, of FIG. 3, is divided into 100 x-coordinate values, and 1000 picture elements per picture line bz are stored in 1000 memory locations of memory mr. By setting the x-coordinate value of the cursor-frame center xc to 50, such that the cursor frame is located in the middle of the screen bs, a central memory area is read out. For instance, with a linear enlargement of a factor of 2 and with a scale factor of ten, the zoom circuit zo determines the desired start address for horizontal readout subtracting a value of twenty-five (half the frame width) from the horizontal cursor position xc. Thus, the horizontal picture elements are read from memory location 250 to location 750.

As has been previously described, the zoom circuit zo can enlarge any area of the viewed image by moving the cursor and selecting the area to be enlarged. When the cursor is moved to a desired location on the screen bs the operator can activate the click command ck to enable the zoom circuit. It will be recognized by a person skilled in the art that the cursor can designate the position on the screen bs to be enlarged in many ways. For example, by moving the cursor to a given position and producing the click command ck, a predetermined sized area surround the cursor may be enlarged. Similarly, the cursor may be positioned four times to define the corners of the area to be enlarged. Any number of well known techniques can be used for defining the area to be enlarged with the cursor. Furthermore, in some situations the zoom circuit zo may be activated once and continuously enlarge an undersized picture or a misproportioned picture to fit properly onto the field of the screen bs being viewed. The zoom circuit zo may also be programmed to activate automatically when it is known an image is misproportioned for the screen; thus eliminating the need for an operator to use the click command ck.

For example, when a wide-screen image, which has an aspect ratio differing considerably from that of the standard 4:3 aspect ratio, is reproduced on the screen bs, there are black stripes at the top and the bottom. The zoom circuit can use a predetermined first enlargement factor to reproduce the number of lines such that the video image gives a full-screen display. The zoom circuit zo enlarges the picture by reproducing only x-coordinate value x, as determined by the position-dependant remote-control transmitter rt. Similarly, if the video image does not have the standard 4:3 aspect ratio, the zoom circuit zo has a fixed second enlargement factor which brings the received video image to a number of lines giving a full-screen display. First, of course, the corresponding video signals must be converted to the baseband by a suitable receiving and decoding device, and a suitable frame memory mr must be made available. The portion to be enlarged is then determined only by the x-coordinate value x, without the aid of the click command ck. The picture portion to be enlarged is selected simply by swinging the remote-control transmitter rt horizontally.

Another special case for the zoom circuit zo is where the received video image does not have the standard 4:3 aspect ratio, but does contain the standard number of lines. Twice the number of lines is permissible. Instead of providing a memory mr which has the capacity to store an entire video frame, it is only necessary to provide a memory mr which has the capacity to store the contents of a single line received. A section of the stored line is stretched to the full screen width by means of the interpolation circuit ip. In this specific case, the enlargement factor of the zoom circuit zo is unity.

Figure 4A:
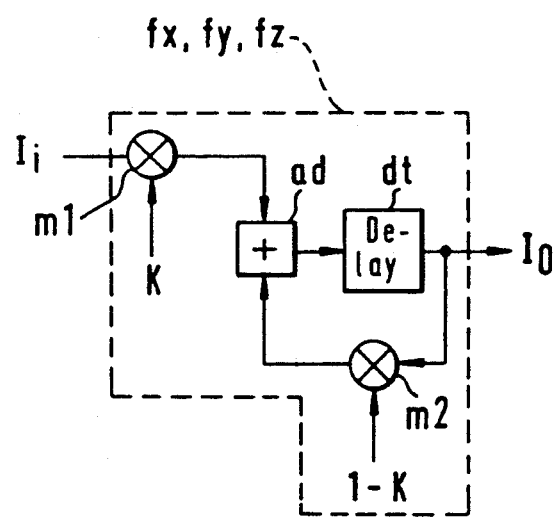
FIG. 4a is a schematic block diagram of a hardware realization of an adaptive filter forming a part of the electrooptical arrangement illustrated in FIG. 1.

Referring now to FIG. 4a, there is shown a hardware realization of adaptive filters fx, fy and fz, previously shown as part of the electrooptical arrangement eop of FIG. 1. Each adaptive filter fx, fy and fz includes first and second multipliers m1 and m2, an adder ad and a delay element dt. Conductors carrying the input signal Ii and the variable filter coefficient K are coupled to respective inputs of first multiplier m1. The output of first multiplier m1 is coupled to one input of adder ad. The output of adder ad is coupled to the input of delay element dt which delays the signal by at least one full sampling period. The output of the delay element dt provides the output signal Io. To the second input of adder ad, a feedback signal is applied, which consists of the product of the output signal Io and the weighting factor 1-K, which is formed by the second multiplier m2. Although adaptive filter is shown in FIG. 4a as a hardware representation, it is most conveniently realized through software in the control microprocessor pr.

Each adaptive filter fx, fy and fz illustrated in FIG. 4a realizes the following algorithm:

$$Ii = [(1-K)Io + KIi]z^{-n}$$

where $z^{-n}$ corresponds to the delay element dt and represents a delay time of a number n of sampling periods, where n is an integer having the value of at least one; and variable coefficient K is a weighting factor having a value not greater than unity, such that small values of K result in a low cutoff frequency, and large values of K result in a high cutoff frequency. The filter coefficient K is determined by the following equation:

$$K = (k\ max - K\ min)\ \text{absolute}\ (Ii - Io)/I\ max + K\ min$$

where K max and K min are the upper and lower limits, respectively, if the filter coefficient K; and I max is the upper limit of filter input Ii, which depends essentially on the resolution bandwidth of the analog-to-digital converter cu. The values for K max, K min and I max, which are stored in the memory of microprocessor pr, determine the range of the cutoff frequency of the adaptive filter fx, fy or fz.

During operation, each adaptive filter fx, fy and fz eliminates the high frequency jitter component caused by the unsteadiness of a user's hand during adjustment of the cursor. Further, the filter distinguishes between the jitter component and the interference in the optical transmission path, which is caused by signal noise or spurious signals, e.g., the beam chopping frequency. As one can ascertain from the algorithm, the difference in values between the input signal Ii and the output signal Io are employed in a feedback loop which adjusts the value of the output signal Io.

Referring now to FIG. 4b, a timing diagram illustrates the operation of the adaptive filters fx, fy and fz. FIG. 4b1 shows two scenarios in which the values for the input and output signals Ii and Io are varied. In scenario A, shown in dash, the cursor is moved quickly from a first position I to a distant second position 11. The quick motion, which represents jitter, causes a large difference in values between the input and output signals Ii and Io. Because the value of the filter coefficient K is linearly dependant on the absolute value of the difference between Io and Ii, the value for filter coefficient K increases. Resulting is a corresponding decrease in filter time constant T (see FIG. 4b3), and a corresponding increase in cutoff frequency fg (see FIG. 4b4). As the motion is slowed, value of filter coefficient K is decreased, the corresponding filter time constant T is increased, and the corresponding cutoff frequency fg is decreased. Thus, the associated cutoff frequency fg, shown in FIG. 4b4, jumps during the quick movement of the cursor from a low value to a high value and falls off again as the displayed cursor (actual value) approaches its set position value (desired value).

In scenario B, shown in solid, the cursor is moved more slowly from first position I to second position II. The slower motion causes a smaller difference in values between the input and output signals Ii and Io. As a result, the filter coefficient K, the filter time constant T (see FIG. 4b3), and the cutoff frequency fg (see FIG. 4b4) exhibit less change. Thus, small, but fast jittering movements are effectively suppressed by the low cutoff frequency of the adaptive filter, while slow, large cursor movements cause the adaptive filter to sample at higher frequencies. As a result, the cursor easily follows every movement of an unsteady hand such that it can be finely adjusted on the screen.

Referring now to FIG. 5, there are shown five examples of how the present invention facilitates the remote control of a video display system. Referring first to FIG. 5a, one image is shown on a main screen bs, and four additional images are displayed in four menu field insets bs1-bs4 using a conventional multipicture display technique. By moving cursor cr to one of the four smaller menu fields and depressing the click command key on the transmitter, the corresponding program is selected as the main program, and is displayed on the main screen bs.

In FIG. 5b, the cursor is illustrated on the screen bs as a cross rk and as a rectangular frame rr. The center xc of the frame rr is defined by the cursor coordinates x and y. The values of the maximum coordinates xmax and ymax are defined within the bounds of the screen bs; however, maximum coordinates located outside the screen may instead be defined. A first television image is shown on the main screen and an additional television image is contained within the frame rr. By actuating the transmitter key for the click command ck, the small inset picture is "attached" to the frame rr. By moving rectangular frame rr, the position of a small inset picture is freely moved on the screen. By means of the next click command ck, the inset picture is "released" by the frame rr at the desired position. In this mode, the microprocessor pr changes the respective write addresses of the large and small pictures in a frame memory mr via the x- and y- coordinate values x, y of the cursor. In view of the previously described zoom circuit, it will be recognized that the portion of the television image "attached" to the frame rr and defined by the edges of the frame rr, can be enlarged and viewed across the entire field of view.

Referring to FIG. 5c, a screen bs displays symbolic representations of analog functions which are generated by the first character generator zg1. The lower bars Vol and Contrl, which are variable in length, symbolically represent slider controls for volume and contrast, respectively. The menu field HELP, located above the two bars, initiates a help function which allows a user to select the desired control function in an interactive mode.

In FIG. 5d, there is shown another means of selecting television images with the aid of the frame rr. Here, the various programs are sequentially displayed in the fields. For example, channels 1, 2 and 3 are shown in the first three fields. Further, channels 4, 5 and 6 are shown in the following three fields, which are off the screen. Thus, a chain is formed. Using the frame rr and the click command ck, this chain is "seised" at an arbitrary point and advanced or retracted until the desired program appears in the displayed frame rr. By actuating a further click command ck, the desired program is then selected and transferred to the main screen bs.

In FIG. 5e, the television image displayed on the screen bs has an aspect ratio that is different from that of the screen bs. As a result, only a portion of the television image is displayed, with the flanks being clipped off. To display either flank of the image, the remote-control transmitter is swung to the left or the right, which has the effect of swinging the entire image, including the flanks, to the left or the right. In this manner, one flake is displayed. Similarly, if the television receiver is provided with the previously described zoom circuit zo, the detail to be enlarged can be determined simply by swinging the remote-control transmitter.

This specific embodiment of the present invention is intended to be illustrative only. It will be understood that many variations and modifications can be made to the present invention by those of ordinary skill in the art. Therefore, it is manifestly intended that this invention be only limited by the claims and the equivalents thereof.

What is claimed is:

1. In a remotely controlled video display apparatus having a screen for displaying at least one video signal, a zoom system for enlarging a selected portion of said video signal on said screen, comprising:

a remote transmitter means for transmitting positional signals with intensities indicative of said transmitter, wherein an unsteady motion of said transmitter creates a high frequency component in each of said positional signals;

an electrooptical control means, responsive to said positional signals, for controlling the position of a cursor on said screen in response to the motion of said transmitter means, whereby said cursor is used to determine said selected portion of said video signal on said screen to be enlarged, said control means receiving said digitizing said positional signals, filtering said high frequency component from each of said positional signals, resolving said positional signals into coordinate values indicative of the position of said cursor on said screen and displaying said cursor on said screen; and a zoom means for enlarging said selected portion of said video signal chosen by an operator on said screen by said cursor, said zoom means including a picture interpolation means for interpolating a video frame from said selected portion of said video signal.

2. The system of claim 1 wherein said zoom means includes a memory means for storing at least one frame of said video signal, and a readout means for reading, from said memory means, said selected portion of said video signal to be enlarged.

3. The system of claim 2 wherein said picture interpolation means reads said video frame from said selected portion of said video signal from said memory means.

4. The system of claim 3 wherein said cursor is a substantially rectangular frame where said selected portion of said video signal to be enlarged is defined by the edges of said substantially rectangular frame.

5. The system of claim 3 wherein said video signal includes a picture-in-picture display whereby a smaller video image is displayed atop a larger video image and wherein said smaller video image can be chosen as said selected portion of said video signal by said cursor.

6. The system of claim 3 wherein said video signal is transmitted in a format smaller than said screen and wherein said zoom means has a first enlargement factor that enlarges the displayed video signal to a size producing a full display on said screen.

7. The system of claim 6 wherein said video signal is transmitted in a wide screen format whereby said zoom means has enlarges said video signal by a predetermined factor that enlarges the displayed video signal to a number of lines that produce full display on said screen.

8. The system of claim 6 wherein said video signal does not have a 4:3 aspect ratio but contains a standard number of lines and said zoom means has a second enlargement factor equal to unity.

9. The system of claim 8 wherein said memory means stores one of said lines, in said video signal, at a time.

10. The system of claim 6 wherein said video signal does not have a 4:3 aspect ratio and wherein said zoom means has an enlargement factor which enlarges the displayed video signal, to a number of lines producing a full display on said screen.

11. A zoom system for remotely controlling a video display apparatus having a screen for displaying at least one video signal, said system comprising:

transmitter means for transmitting a plurality of signals having intensities indicative of the motion of said transmitter means, and for transmitting an electromagnetic command signal containing at least one coded command, wherein an unsteady motion of said transmitter means creates a high frequency component in each one of said plurality of positional signals;

electrooptical means responsive to said transmitted electromagnetic positional signals for controlling said video display apparatus by moving a cursor on said screen in response to the motion of said transmitter means, said electrooptical means including:

receiving means for receiving said command signal and said plurality of positional signals;

digitizing means, responsive to said receiving means, for digitizing said command signal and each one of said positional signals, the digital value of each one of said digitized positional signals being indicative of the intensity of said corresponding one positional signal;

adaptive filter means, responsive to said digitizing means, for filtering out said high frequency component from each one of said digitized positional signals;

resolving means, responsive to said adaptive filter means, for resolving said plurality of filtered digitized positional signals into coordinate values indicative of the position of the cursor on the screen;

menu controller means for processing said command signal and, in accordance with said coordinate values determined by said resolving means, for displaying the position of the cursor on the screen and for controlling said video display apparatus; and a zoom means for enlarging a portion of said video signal on said screen, wherein said portion is selected by said cursor.

12. The system of claim 11 wherein said zoom means includes a memory means for storing at least one frame of said video signal and a readout means for reading said portion of said video signal from said memory means.

13. The system of claim 12 wherein said zoom means further includes a picture interpolation means for interpolating a video frame from said portion of said video signal read from said memory means.

14. The system of claim 13 wherein said zoom means automatically enlarges said video signal to fit on said screen if said video signal is transmitted in a format that does not match the size of said screen.

15. The system of claim 14 wherein said video signal is transmitted in a wide screen format and said zoom means has a first enlargement factor that enlarges said video signal to a number of lines providing a full display on said screen.

16. The system according to claim 15, wherein said video signal does not have a 4:3 aspect ratio but contains a standard number of lines, and wherein said zoom means has a second enlargement factor equal to unity for providing a full display on said screen.

17. The system of claim 2, wherein said zoom means further includes a first and second address generator for generating modified horizontal and vertical start addresses to said memory means, respectively, for said selected portion of said video signal.

18. The system of claim 17, wherein said first address generator is responsive to a system clock signal, a horizontal clock signal and a modified horizontal coordinate value to provide said modified horizontal start address; and said second address generator is responsive to said system clock signal, a vertical clock signal and a modified vertical coordinate value to provide said modified vertical start address.

* * * * *